(12) United States Patent
Sasaki (10) Patent No.: US 10,979,015 B2
(45) Date of Patent: Apr. 13, 2021

(54) COMMON-MODE CHOKE COIL

(71) Applicant: Murata Manufacturing Co., Ltd., Kyoto-fu (JP)

(72) Inventor: Katsufumi Sasaki, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/519,708

(22) Filed: Jul. 23, 2019

(65) Prior Publication Data
US 2020/0052673 A1 Feb. 13, 2020

(30) Foreign Application Priority Data
Aug. 8, 2018 (JP) .............................. JP2018-149545

(51) Int. Cl.
| | |
|---|---|
| *H03H 7/09* | (2006.01) |
| *H01F 17/00* | (2006.01) |
| *H01F 27/32* | (2006.01) |
| *H03H 7/42* | (2006.01) |
| *H03H 1/00* | (2006.01) |
| *H01F 17/04* | (2006.01) |

(52) U.S. Cl.
CPC ........... *H03H 7/09* (2013.01); *H01F 17/0013* (2013.01); *H01F 27/32* (2013.01); *H03H 7/427* (2013.01); *H01F 2017/0073* (2013.01); *H01F 2017/0093* (2013.01); *H01F 2017/048* (2013.01); *H03H 2001/0092* (2013.01)

(58) Field of Classification Search
CPC ........ H03H 7/427; H03H 7/09; H03H 7/0115; H03H 2001/0085; H01F 17/0013

USPC .................................................. 333/181, 185
See application file for complete search history.

(56) References Cited

U.S. PATENT DOCUMENTS

| | | | |
|---|---|---|---|
| 2014/0145796 A1* | 5/2014 | Okumura | H03H 7/09 333/177 |
| 2017/0294257 A1* | 10/2017 | Omori | H03H 7/09 |
| 2019/0122801 A1* | 4/2019 | Kim | H01F 27/29 |
| 2019/0333673 A1* | 10/2019 | Oomori | H01F 19/00 |

FOREIGN PATENT DOCUMENTS

| | | |
|---|---|---|
| CN | 106664069 A | 5/2017 |
| JP | 2008-198863 A | 8/2008 |
| JP | 2014-107435 A | 6/2014 |
| JP | 2016-178278 A | 10/2016 |
| TW | 201742376 A | 12/2017 |

OTHER PUBLICATIONS

An Office Action; "Notification of Reasons for Refusal," mailed by the Japanese Patent Office dated Jan. 19, 2021, which corresponds to Japanese Patent Application No. 2018-149545 and is related to U.S. Appl. No. 16/519,708 with English language translation.

* cited by examiner

*Primary Examiner* — Rakesh B Patel
(74) *Attorney, Agent, or Firm* — Studebaker & Brackett PC (57) ABSTRACT

A common-mode choke coil includes a first filter unit and a second filter unit, each of which serves as a common-mode filter unit and is formed by arranging a primary coil and a secondary coil in a stacking direction. Of the first filter unit and the second filter unit, the first filter unit has a resonant frequency different from that of the second filter unit, and the line length is different between the primary coil and the secondary coil.

20 Claims, 6 Drawing Sheets

COMMON-MODE CHOKE COIL

CROSS-REFERENCE TO RELATED APPLICATION

This application claims benefit of priority to Japanese Patent Application No. 2018-149545, filed Aug. 8, 2018, the entire content of which is incorporated herein by reference.

BACKGROUND

Technical Field

The present disclosure relates to common-mode choke coils.

Background Art

In recent years, as signal transmission interfaces, standards such as Universal Serial Bus (USB) and the like are increasingly prevalent and are being used in a wide variety of electronic devices. In such signal transmission interfaces that use differential signals, a common-mode choke coil is sometimes used as a measure against noise.

In the common-mode choke coil, a common-mode filter unit is formed of a primary coil and a secondary coil that are magnetically coupled. Further, Japanese Unexamined Patent Application Publication No. 2016-178278 proposed a common-mode choke coil that removes noise in a wide bandwidth by connecting in series two common-mode filter units whose resonant frequencies are different from each other.

SUMMARY

The inventor of the present application discovered that a common-mode choke coil including two common-mode filter units whose resonant frequencies are different from each other, such as one described in Japanese Unexamined Patent Application Publication No. 2016-178278, may be at risk of having an antiresonance in the differential-mode transmission characteristic (Sdd21) and causing the transmission property of differential signals to be hampered. This is not limited only to the common-mode choke coil including two common-mode filter units whose resonant frequencies are different from each other. The same thing may also occur in the case of a common-mode choke coil including a plurality of common-mode filter units in which the plurality of common-mode filter units includes one common-mode filter unit whose resonant frequency is different from a resonant frequency of another common-mode filter unit.

The present disclosure thus reduces an influence on the transmission property of differential signals in a common-mode choke coil including a plurality of common-mode filter units in which the plurality of common-mode filter units includes one common-mode filter unit whose resonant frequency is different from a resonant frequency of another common-mode filter unit.

A common-mode choke coil according to one aspect of the present disclosure includes a plurality of common-mode filter units each formed by arranging a primary coil and a secondary coil in a stacking direction. The plurality of common-mode filter units includes one common-mode filter unit whose resonant frequency is different from a resonant frequency of another common-mode filter unit and one common-mode filter unit in which a line length is different between the primary coil and the secondary coil.

This configuration enables the reduction of signal attenuation due to an antiresonance in Sdd21.

Preferably, in the foregoing common-mode choke coil, the plurality of common-mode filter units includes a first filter unit and a second filter unit whose resonant frequencies are different from one another, and between the first filter unit and the second filter unit, the primary coils are connected in series and the secondary coils are connected in series. In the second filter unit, a plurality of coil conductors are arranged along the stacking direction, each of the plurality of coil conductors being wound in a spiral shape, and a reference primary coil conductor and a reference secondary coil conductor are adjacent to one another in the stacking direction and have opposite winding directions, the reference primary coil conductor being one of the plurality of coil conductors that constitutes the primary coil, the reference secondary coil conductor being one of the plurality of coil conductors that constitutes the secondary coil. Also, a line length of a far side coil is longer than a line length of a near side coil, where, of the primary coil and the secondary coil of the first filter unit, one that is arranged at a more distant position is the far side coil and one that is arranged at a closer position is the near side coil, using, as references, line lengths from the reference primary coil conductor and the reference secondary coil conductor. Note that in the present application, the spiral shape means a helix wound in a planar form.

This configuration enables a further reduction of the signal attenuation due to an antiresonance in Sdd21.

Preferably, in the foregoing common-mode choke coil, the plurality of common-mode filter units includes a first filter unit and a second filter unit whose resonant frequencies are different from one another, and between the first filter unit and the second filter unit, the primary coils are connected in series and the secondary coils are connected in series. In the second filter unit, a first layer coil conductor, a second layer coil conductor, a third layer coil conductor, and a fourth layer coil conductor are arranged in order of mention along the stacking direction, each of the first layer coil conductor, the second layer coil conductor, the third layer coil conductor, and the fourth layer coil conductor being wound in an spiral shape, following one of the primary coil and the secondary coil of the first filter unit, the fourth layer coil conductor and the second layer coil conductor are connected in series in order of mention, and following another of the primary coil and the secondary coil of the first filter unit, the third layer coil conductor and the first layer coil conductor are connected in series in order of mention. Also, a line length of a far side coil is longer than a line length of a near side coil, where, of the primary coil and the secondary coil of the first filter unit, one that follows and is connected to the fourth layer coil conductor is the far side coil, and one that follows and is connected to the third layer coil conductor is the near side coil.

This configuration enables a further reduction of the signal attenuation due to an antiresonance in Sdd21.

Preferably, in the foregoing common-mode choke coil, L1 and L2 are set within a range of L2<L1≤1.5×L2, where L1 is the line length of the far side coil, and L2 is the line length of the near side coil. This configuration enables a further reduction of the signal attenuation due to an antiresonance in Sdd21.

Preferably, in the foregoing common-mode choke coil, in the far side coil, the line length is adjusted on a winding center side. This configuration enables to eliminate the need for changing the size of the outer shape of the far side coil when making its line length longer than that of the near side coil, thereby enabling to suppress an increase in size of the common-mode choke coil.

Preferably, in the foregoing common-mode choke coil, an inside diameter of the far side coil is smaller than an inside diameter of the near side coil. This configuration enables to eliminate the need for changing the size of the outer shape of the far side coil when making its line length longer than that of the near side coil, thereby enabling to suppress an increase in size of the common-mode choke coil.

Preferably, in the foregoing common-mode choke coil, line lengths of the primary coil and the secondary coil of the first filter unit are shorter than line lengths of the primary coil and the secondary coil of the second filter unit, respectively. This configuration enables to extend the line length of the far side coil in the first filter unit that uses less space than the second filter unit, thereby enabling to suppress an increase in size of the common-mode choke coil.

Preferably, in the foregoing common-mode choke coil, a resonant frequency of the first filter unit is higher than a resonant frequency of the second filter unit. This configuration enables to extend the line length of the far side coil in the first filter unit that uses less space than the second filter unit, thereby enabling to suppress an increase in size of the common-mode choke coil.

Preferably, in the foregoing common-mode choke coil, in the second filter unit, of the primary coil and the secondary coil, one that is connected in series to the near side coil has a longer line length than one that is connected in series to the far side coil. This configuration enables a difference in line length between the primary coil and the secondary coil created in the first filter unit to be reduced in the second filter unit.

Preferably, in the foregoing common-mode choke coil, a total line length of the primary coils of the first filter unit and the second filter unit is substantially equal to a total line length of the secondary coils of the first filter unit and the second filter unit. This configuration enables a difference in line length between the primary coil and the secondary coil created in the first filter unit to be offset in the second filter unit.

Preferably, in the foregoing common-mode choke coil, among the plurality of common-mode filter units, the primary coils are connected in series, and the secondary coils are connected in series. This configuration enables input-output terminals of the respective common-mode filter units to be brought together, thereby facilitating the connection.

Preferably, in the foregoing common-mode choke coil, the plurality of common-mode filter units is arranged in a direction orthogonal to the stacking direction. This configuration enables the reduction of magnetic coupling between the common-mode filter units, thereby enabling to suppress an adverse effect on characteristics of the common-mode choke coil.

Preferably, the foregoing common-mode choke coil further includes a base body in which a plurality of insulation layers are stacked on top of another, and each of the primary coils and the secondary coils of the plurality of common-mode filter units includes a coil conductor wound on the insulation layer. This configuration enables to contain the respective common-mode filter units within a single base body, thereby facilitating the handling of the common-mode choke coil.

Preferably, the foregoing common-mode choke coil further includes a first outer electrode, a second outer electrode, a third outer electrode, and a fourth outer electrode that are formed in the base body, the first outer electrode and the second outer electrode are electrically connected with the primary coils of the plurality of common-mode filter units connected in series in between, and the third outer electrode and the fourth outer electrode are electrically connected with the secondary coils of the plurality of common-mode filter units connected in series in between. This configuration enables inputs and outputs to and from the respective common-mode filter units to be brought together at the first outer electrode, the second outer electrode, the third outer electrode, and the fourth outer electrode, thereby facilitating the connection.

The common-mode choke coils according to preferred embodiments of the present disclosure enable the reduction of signal attenuation due to an antiresonance in Sdd21, thereby reducing the influence on the transmission property of differential signals.

Other features, elements, characteristics and advantages of the present disclosure will become more apparent from the following detailed description of preferred embodiments of the present disclosure with reference to the attached drawings.

DETAILED DESCRIPTION

Hereinafter, an embodiment is described in detail with reference to the accompanying drawings. Note that some of the accompanying drawings may illustrate enlarged constituting elements to facilitate the understanding. Further, some of the accompanying drawings may illustrate constituting elements in a different scale ratio compared with that of actual constituting elements or that of other accompanying drawings.

Figure 1:
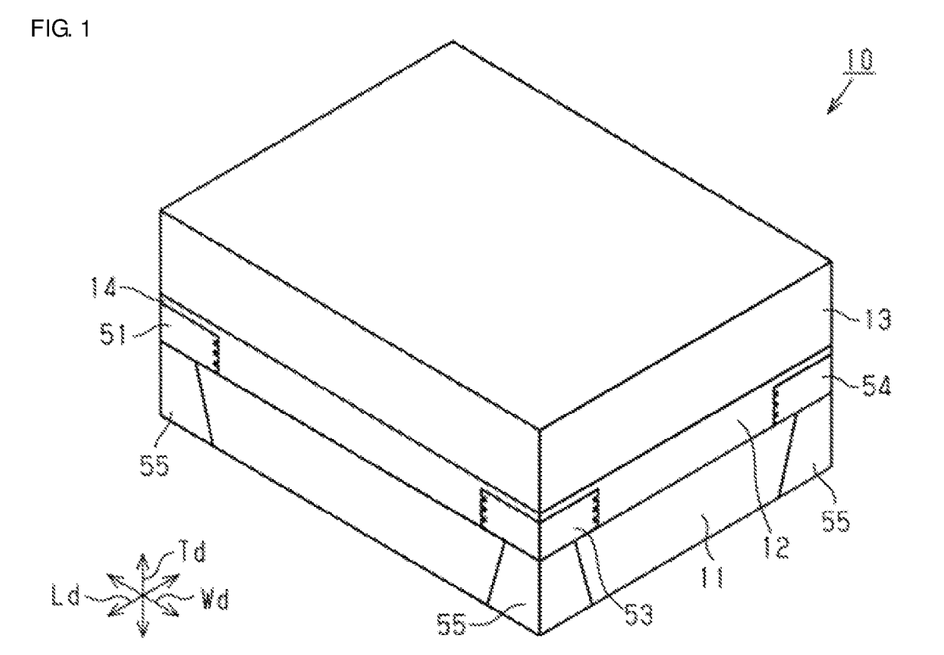
FIG. 1 is a perspective view of a common-mode choke coil according to an embodiment.
Figure 2:
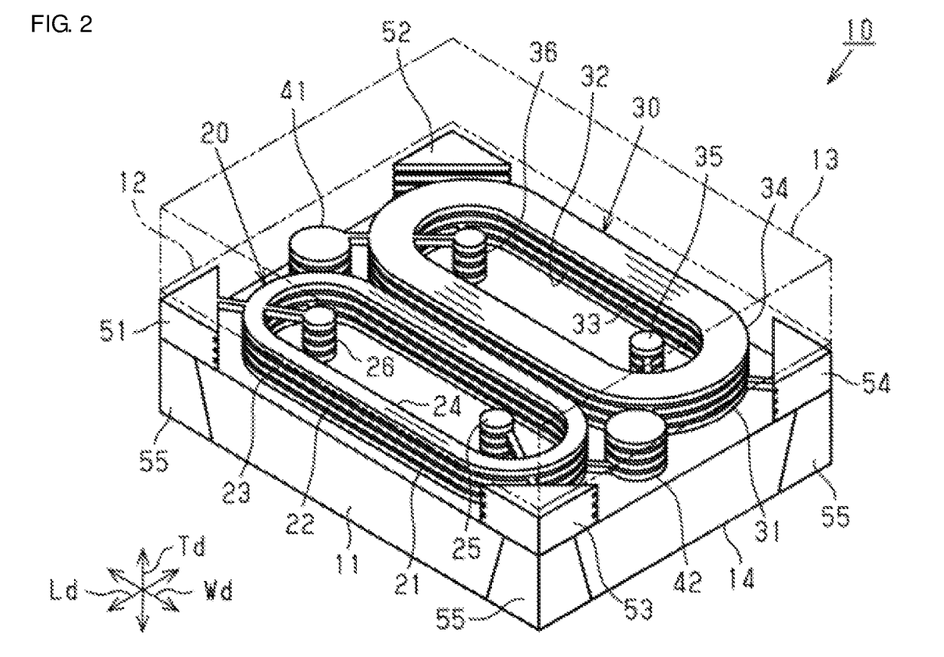
FIG. 2 is a transparent perspective view of coil conductors of a common-mode choke coil according to an embodiment.
Figure 3:
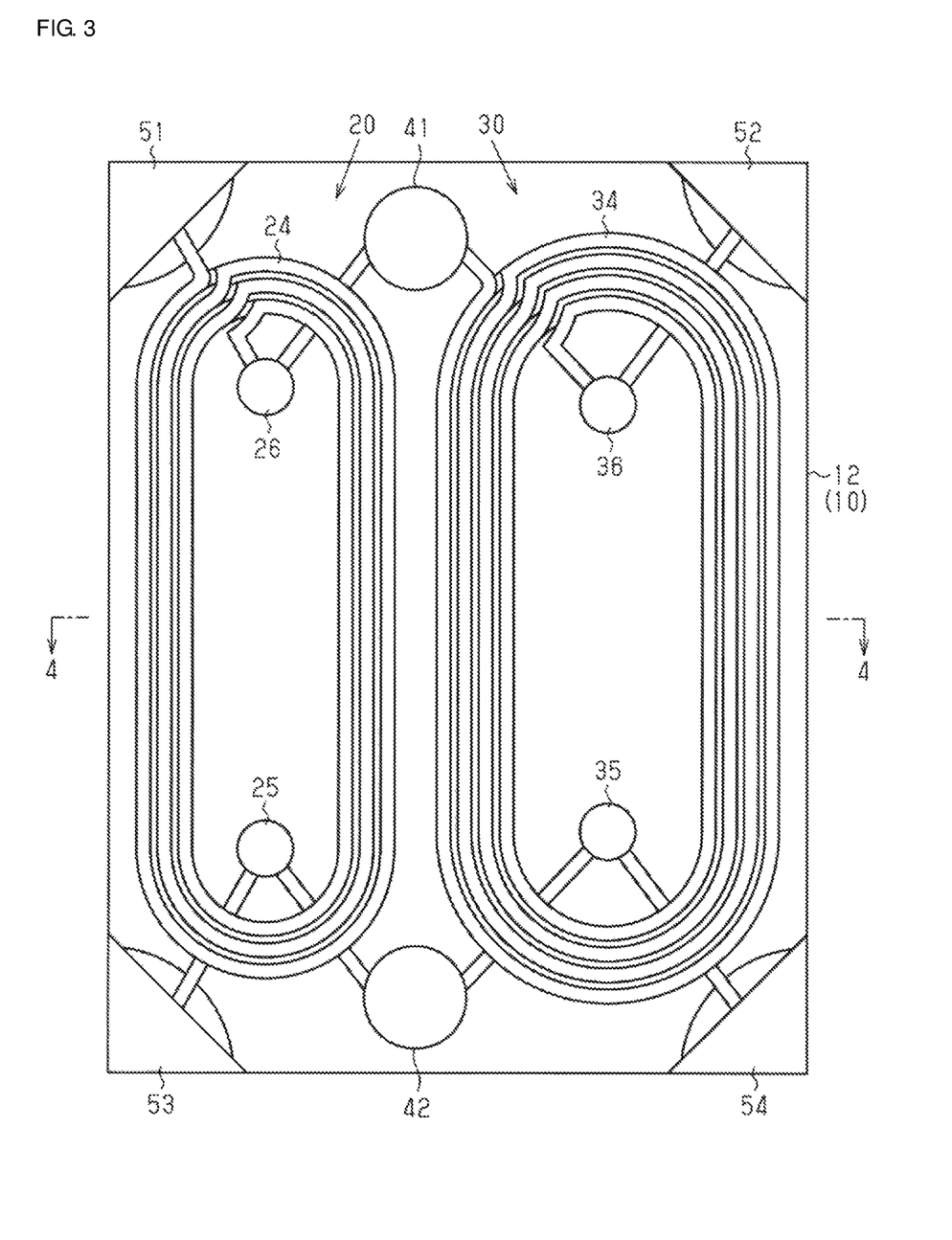
FIG. 3 is a top view of a common-mode choke coil according to an embodiment.
Figure 4:
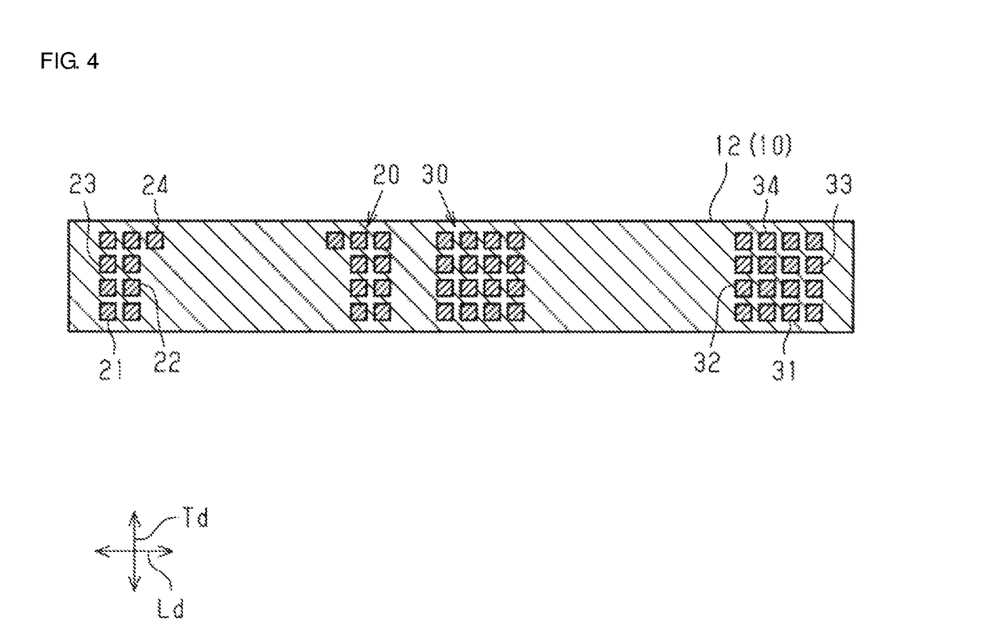
FIG. 4 is a cross-sectional view of a common-mode choke coil according to an embodiment.
Figure 5:
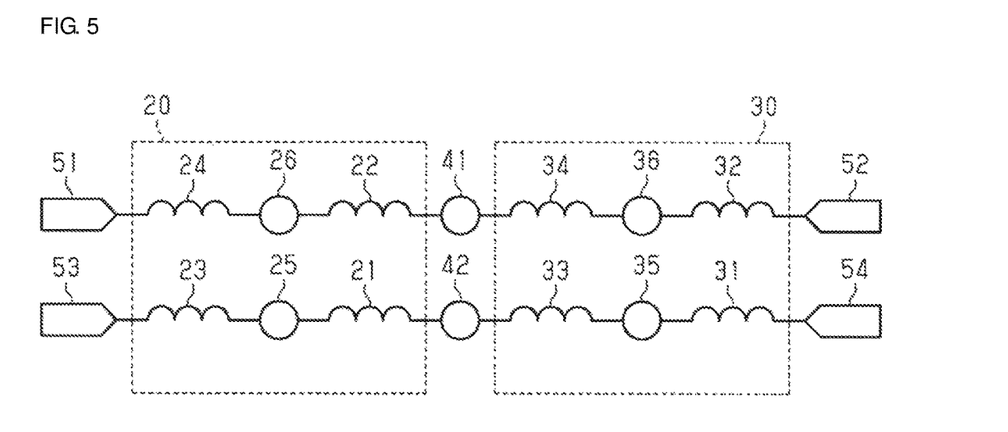
FIG. 5 is a circuit diagram of a common-mode choke coil according to an embodiment.

FIG. 1 is a perspective view illustrating an exterior shape of a common-mode choke coil 10 according to an embodiment. FIG. 2 is a transparent perspective view illustrating an internal configuration of the common-mode choke coil 10, which contains a first filter unit 20 and a second filter unit 30. FIG. 3 is a top view illustrating coil conductors included in the first filter unit 20 and the second filter unit 30. FIG. 4 is a cross-sectional view at line 4-4 of FIG. 3. FIG. 5 is a circuit diagram illustrating an electrical connection relationship of the first filter unit 20 and the second filter unit 30.

The common-mode choke coil 10 illustrated in FIG. 1 and FIG. 2 includes a base body 14, the first filter unit 20, the second filter unit 30, and first to fourth outer electrodes 51 to 54 and is configured to form, for example, a substantially rectangular parallelepiped shape. The common-mode choke coil 10 of the present embodiment is an electronic component that includes two common-mode filter units (the first filter unit 20 and the second filter unit 30) formed by stacking a plurality of coil conductors on top of each other, which will be described later, to arrange a primary coil and a secondary coil along the stacking direction. The common-mode choke coil 10 has a structure such that the first filter unit 20 and the second filter unit 30, whose resonant frequencies are different from each other, are arranged in a direction orthogonal to the stacking direction of the primary coil and the secondary coil. In the following description, the stacking direction of the coil conductors in each filter unit (the stacking direction of the primary coil and the secondary coil) is defined as a height direction Td, the arranging direction of the filter units 20 and 30, which is orthogonal to the height direction Td, is defined as a length direction Ld, and a direction orthogonal to both the height direction Td and the length direction Ld is defined as a width direction Wd. Further, a mounting face side of the common-mode choke coil 10, with which the common-mode choke coil 10 is mounted on a circuit board or the like, is defined as a bottom face side, and a side opposite to the bottom face side is defined as a top face side. Further, the bottom face and the top face of the common-mode choke coil 10 of the present embodiment are configured to face each other in the height direction Td.

As illustrated in FIG. 1 and FIG. 2, the base body 14 is formed, for example, by stacking a plurality of insulation layers 11 to 13 in the height direction Td. The insulation layers 11 and 13 are each composed of a magnetic material such as, for example, a ferrite substrate, a resin containing magnetic metal powder, or the like, and the insulation layer 12 is composed of a non-magnetic material such as, for example, resin, glass, or the like. Further, the insulation layer 12 arranged between the insulation layer 11 and the insulation layer 13 has a configuration in which a plurality of insulation layers is stacked on top of each other and contains the first filter unit 20 and the second filter unit 30 therein. Further, on the insulation layer 12, first to fourth outer electrodes 51 to 54 are formed.

As illustrated in FIG. 2 to FIG. 5, the first filter unit 20 includes a first layer coil conductor 21, a second layer coil conductor 22, a third layer coil conductor 23, and a fourth layer coil conductor 24, which are arranged along the height direction Td. The first to fourth layer coil conductors 21 to 24 are stacked on top of each other from the bottom face side to the top face side, in order of the first layer coil conductor 21, the second layer coil conductor 22, the third layer coil conductor 23, and the fourth layer coil conductor 24. Each of the first to fourth layer coil conductors 21 to 24 is formed of, for example, a wiring pattern composed of a metal such as Cu, Ag, or the like, wound in an approximately spiral shape on each of the insulation layers of the insulation layer 12. The first to fourth layer coil conductors 21 to 24 are surrounded by insulation layers.

An inner circumference end portion of the first layer coil conductor 21 is connected to an inner circumference end portion of the third layer coil conductor 23 via a first via electrode 25 that penetrates one or more of the insulation layers of the insulation layer 12 in the height direction Td. An inner circumference end portion of the second layer coil conductor 22 is connected to an inner circumference end portion of the fourth layer coil conductor 24 via a second via electrode 26 that penetrates one or more of the insulation layers of the insulation layer 12 in the height direction Td. In this way, in the first filter unit 20, the primary coil containing the first layer coil conductor 21, the first via electrode 25, and the third layer coil conductor 23 and the secondary coil containing the second layer coil conductor 22, the second via electrode 26, and the fourth layer coil conductor 24 are formed. Further, in the first filter unit 20, the primary coil and the secondary coil are arranged in the stacking direction, thereby allowing the primary coil and the secondary coil to be magnetically coupled to each other during operation.

As illustrated in FIG. 3, when viewed from one of the height directions Td, for example from the top face side, the first layer coil conductor 21 and the second layer coil conductor 22 are formed in an approximately spiral shape that winds in the same direction, for example a clockwise direction from the outer circumference end portion to the inner circumference end portion. Further, for example, when viewed from the top face side, the third layer coil conductor 23 and the fourth layer coil conductor 24 are formed in an approximately spiral shape that winds in the same direction, for example a counterclockwise direction from the outer circumference end portion to the inner circumference end portion. In other words, the second layer coil conductor 22 and the third layer coil conductor 23 are adjacent to each other in the height direction Td and have opposite winding directions.

According to this, in the first filter unit 20, when differential signals are input at the outer circumference end portions of the first layer coil conductor 21 and the second layer coil conductor 22, the primary coil and the secondary coil generate magnetic fluxes in opposite directions, cancelling each other out. Accordingly, the first filter unit 20 as a whole has substantially no inductance for the differential signals, and the differential signals are output from the outer circumference end portions of the third layer coil conductor 23 and the fourth layer coil conductor 24 while maintaining their respective waveforms.

On the other hand, in the first filter unit 20, when a common-mode noise is input at the outer circumference end portions of the first layer coil conductor 21 and the second layer coil conductor 22, the primary coil and the secondary coil generate magnetic fluxes in the same direction, reinforcing each other. Accordingly, the first filter unit 20 as a whole has a large inductance against the common-mode noise, thereby attenuating the common-mode noise to be output from the outer circumference end portions of the third layer coil conductor 23 and the fourth layer coil conductor 24. In this way, the first filter unit 20 serves as a common-mode filter unit formed by magnetically coupling the primary coil and the secondary coil that are arranged in the stacking direction.

As illustrated in FIG. 2 to FIG. 5, as in the case with the first filter unit 20, the second filter unit 30 includes a first layer coil conductor 31, a second layer coil conductor 32, a third layer coil conductor 33, and a fourth layer coil conductor 34, which are arranged along the height direction Td. The first to fourth layer coil conductors 31 to 34 are stacked from the bottom face side to the top face side in order of the first layer coil conductor 31, the second layer coil conductor 32, the third layer coil conductor 33, and the fourth layer coil conductor 34. Each of the first to fourth layer coil conductors 31 to 34 is formed of, for example, a wiring pattern composed of a metal such as Cu, Ag, or the like, wound in an approximately spiral shape on each of the insulation layers of the insulation layer 12. The first to fourth layer coil conductors 31 to 34 are surrounded by insulation layers.

The first layer coil conductor 31 of the second filter unit 30 is arranged in such a way that, for example, the first layer coil conductor 31 is in the same layer as the first layer coil conductor 21 of the first filter unit 20, namely substantially coincides with the first layer coil conductor 21 in the height direction Td. Further, the second layer coil conductor 32 of the second filter unit 30 is arranged in such a way that, for example, the second layer coil conductor 32 is in the same layer as the second layer coil conductor 22 of the first filter unit 20, namely substantially coincides with the second layer coil conductor 22 in the height direction Td. The third layer coil conductor 33 of the second filter unit 30 is arranged in such a way that, for example, the third layer coil conductor 33 is in the same layer as the third layer coil conductor 23 of the first filter unit 20, namely substantially coincides with the third layer coil conductor 23 in the height direction Td. Further, the fourth layer coil conductor 34 of the second filter unit 30 is arranged in such a way that, for example, the fourth layer coil conductor 34 is in the same layer as the fourth layer coil conductor 24 of the first filter unit 20, namely substantially coincides with the fourth layer coil conductor 24 in the height direction Td.

An inner circumference end portion of the first layer coil conductor 31 is connected to an inner circumference end portion of the third layer coil conductor 33 via a first via electrode 35 that penetrates one or more of the insulation layers of the insulation layer 12 in the height direction Td. An inner circumference end portion of the second layer coil conductor 32 is connected to an inner circumference end portion of the fourth layer coil conductor 34 via a second via electrode 36 that penetrates one or more of the insulation layers of the insulation layer 12 in the height direction Td. In this way, in the second filter unit 30, the primary coil containing the first layer coil conductor 31, the first via electrode 35, and the third layer coil conductor 33 and the secondary coil containing the second layer coil conductor 32, the second via electrode 36, and the fourth layer coil conductor 34 are formed. Further, in the second filter unit 30, the primary coil and the secondary coil are arranged in the stacking direction, thereby allowing the primary coil and the secondary coil to be magnetically coupled to each other during operation.

As illustrated in FIG. 3, when viewed from one of the height directions Td, for example from the top face side, the first layer coil conductor 31 and the second layer coil conductor 32 are formed in an approximately spiral shape that winds in the same direction, for example the clockwise direction from the outer circumference end portion to the inner circumference end portion. Further, for example, when viewed from the top face side, the third layer coil conductor 33 and the fourth layer coil conductor 34 are formed in an approximately spiral shape that winds in the same direction, for example the counterclockwise direction from the outer circumference end portion to the inner circumference end portion. In other words, the second layer coil conductor 32 and the third layer coil conductor 33 are adjacent to each other in the height direction Td and have opposite winding directions.

According to this, in the second filter unit 30, when differential signals are input at the outer circumference end portions of the first layer coil conductor 31 and the second layer coil conductor 32, the primary coil and the secondary coil generate magnetic fluxes in opposite directions, cancelling each other out. Accordingly, the second filter unit 30 as a whole has substantially no inductance for the differential signals, and the differential signals are output from the outer circumference end portions of the third layer coil conductor 33 and the fourth layer coil conductor 34 while maintaining their respective waveforms.

On the other hand, in the second filter unit 30, when a common-mode noise is input at the outer circumference end portions of the first layer coil conductor 31 and the second layer coil conductor 32, the primary coil and the secondary coil generate magnetic fluxes in the same direction, reinforcing each other. Accordingly, the second filter unit 30 as a whole has a large inductance against the common-mode noise, thereby attenuating the common-mode noise to be output from the outer circumference end portions of the third layer coil conductor 33 and the fourth layer coil conductor 34. In this way, the second filter unit 30 serves as a common-mode filter unit formed by magnetically coupling the primary coil and the secondary coil that are arranged in the stacking direction.

As illustrated in FIG. 2 and FIG. 5, the first filter unit 20 and the second filter unit 30 are connected to each other via two intermediate via electrodes 41 and 42. Specifically, the second layer coil conductor 22 of the first filter unit 20 and the fourth layer coil conductor 34 of the second filter unit 30 are connected via the intermediate via electrode 41. Further, the first layer coil conductor 21 of the first filter unit 20 and the third layer coil conductor 33 of the second filter unit 30 are connected via the intermediate via electrode 42. According to this, between the first filter unit 20 and the second filter unit 30, the primary coils are connected in series, and the secondary coils are connected in series.

As illustrated in FIG. 2 and FIG. 5, the fourth layer coil conductor 24 of the first filter unit 20 is connected to the first outer electrode 51. The second layer coil conductor 32 of the second filter unit 30 is connected to the second outer electrode 52. That is to say, in the present embodiment, the first outer electrode 51, the fourth layer coil conductor 24 of the first filter unit 20, the second via electrode 26, the second layer coil conductor 22 of the first filter unit 20, the intermediate via electrode 41, the fourth layer coil conductor 34 of the second filter unit 30, the second via electrode 36, the second layer coil conductor 32 of the second filter unit 30, and the second outer electrode 52 are connected in series in order of mention. In other words, the first outer electrode 51 and the second outer electrode 52 are electrically connected with the primary coil of the first filter unit 20 and the primary coil of the second filter unit 30 connected in series in between.

Further, the third layer coil conductor 23 of the first filter unit 20 is connected to the third outer electrode 53. The first layer coil conductor 31 of the second filter unit 30 is connected to the fourth outer electrode 54. That is to say, in the present embodiment, the third outer electrode 53, the third layer coil conductor 23 of the first filter unit 20, the first via electrode 25, the first layer coil conductor 21 of the first filter unit 20, the intermediate via electrode 42, the third layer coil conductor 33 of the second filter unit 30, the first via electrode 35, the first layer coil conductor 31 of the second filter unit 30, and the fourth outer electrode 54 are connected in series in order of mention. In other words, the third outer electrode 53 and the fourth outer electrode 54 are electrically connected with the secondary coil of the first filter unit 20 and the secondary coil of the second filter unit 30 connected in series in between.

As illustrated in FIG. 1 and FIG. 2, the first to fourth outer electrodes 51 to 54 are configured in such a way that the first to fourth outer electrodes 51 to 54 are set at four corners of the insulation layer 12 of the common-mode choke coil 10 and are exposed outside. Further, the outer electrodes 51 to 54 are respectively connected to corresponding bottom face electrodes 55 on the bottom face side in the height direction Td. The bottom face electrodes 55 are configured so as to be exposed on the bottom face side in the height direction Td. This enables the formation of electrical connection with a circuit pattern or the like on a circuit board using the bottom face electrodes 55 when mounting on the circuit board or the like.

Figure 6:
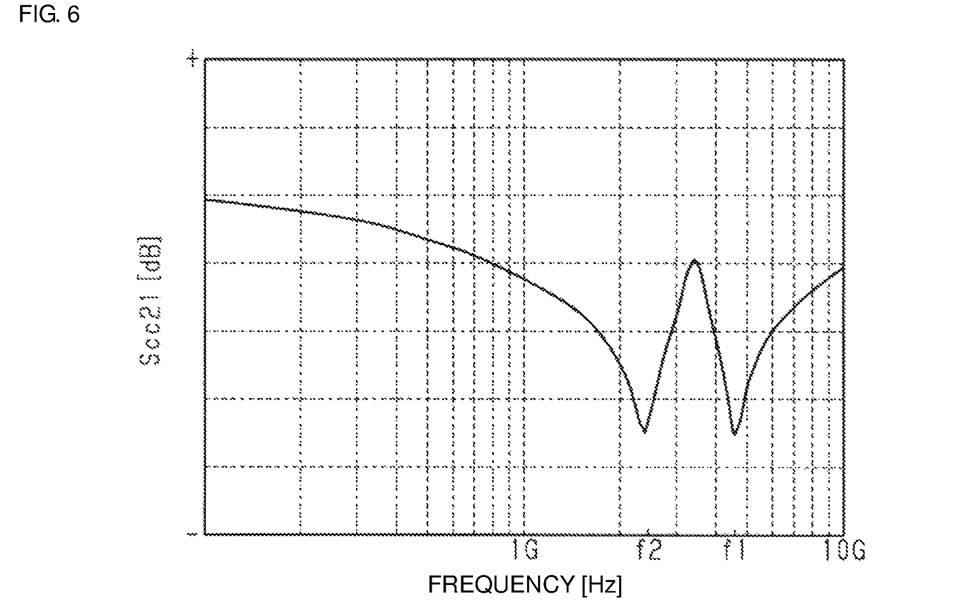
FIG. 6 is a characteristic diagram of a common-mode attenuation characteristic of a common-mode choke coil according to an embodiment.

In the present embodiment, the inductance of the primary coil and the inductance of the secondary coil are different between the filter units 20 and 30 by, for example, setting the numbers of turnings of the coil conductors 21 to 24 and 31 to 34 of the filter units 20 and 30 in such a way that the numbers of turnings thereof are different between the first filter unit 20 and the second filter unit 30. As a result, a resonant frequency f1 of the first filter unit 20 and a resonant frequency f2 of the second filter unit 30 are set different from each other. That is to say, in the common-mode choke coil 10, there is the first filter unit 20 and the second filter unit 30 that have the resonant frequencies f1 and f2 different from each other. More specifically, the common-mode choke coil 10 is configured in such a way that the numbers of turnings of the respective coil conductors 21 to 24 of the first filter unit 20 are less than the numbers of turnings of the respective coil conductors 31 to 34 of the second filter unit 30. Accordingly, the inductance values of the primary coil and the secondary coil of the first filter unit 20 are lower than the inductance values of the primary coil and the secondary coil of the second filter unit 30, respectively. Therefore, as illustrated in FIG. 6, the resonant frequency f1 of the first filter unit 20 is higher than the resonant frequency f2 of the second filter unit 30.

Note that, in the common-mode choke coil 10 of the present embodiment, by arranging the coil conductors 21 to 24 and 31 to 34 of the filter units 20 and 30 in the same layers, namely arranging them in a direction orthogonal to the height direction Td, a magnetic flux generated around the first filter unit 20 is less likely to overlap a magnetic flux generated around the second filter unit 30 when a current is applied. This enables the reduction of magnetic coupling between the first filter unit 20 and the second filter unit 30 and enables to suppress an adverse effect on characteristics of the common-mode choke coil 10.

Figure 7:
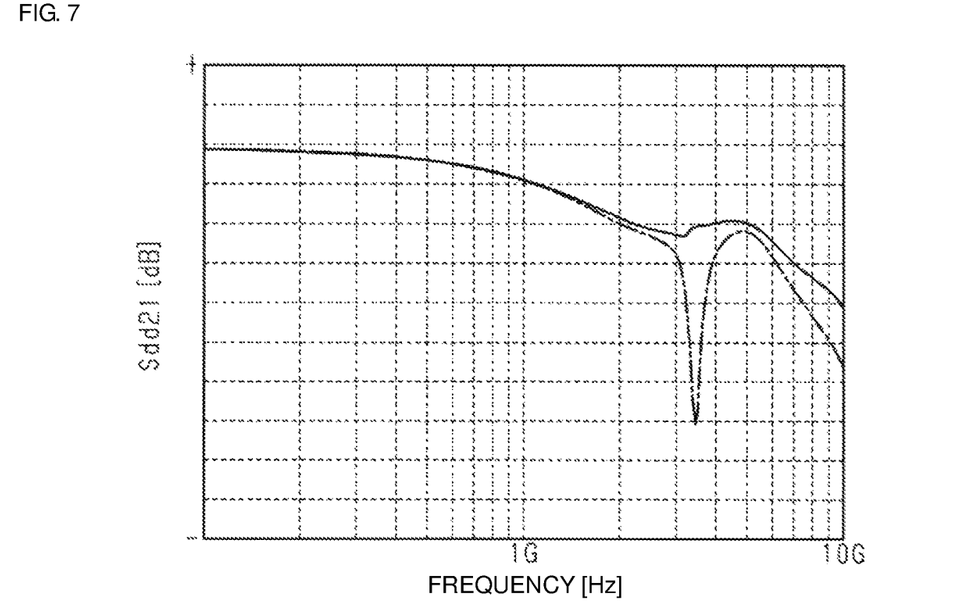
FIG. 7 is a characteristic diagram of a differential-mode transmission characteristic of a common-mode choke coil.

Here, generally, in common-mode choke coils, the line length is set at an approximately equal length between the primary coil and the secondary coil, which constitute a common-mode filter unit. That is to say, like the present example, in the case where a common-mode choke coil includes a plurality of common-mode filter units in which a common-mode filter unit whose resonant frequency is different from a resonant frequency of another common-mode filter unit is included, it is typical to set the line lengths of the primary coil and the secondary coil at an approximately equal length in each of the plurality of common-mode filter units. However, the inventor of the present application discovered that when a common-mode choke coil having such configuration was actually made, a sharp attenuation (a drop part of waveform), namely an antiresonance, occurred in Sdd21 as denoted by a dashed-dotted line in FIG. 7.

Further, unlike a typical designing concept, when the inventor of the present application ventured to include a common-mode filter unit in which the line length is different between the primary coil and the secondary coil, the inventor of the present application further discovered that the occurrence of an antiresonance described above was suppressed. For example, in the common-mode choke coil 10 of the present example, the line length of the secondary coil of the first filter unit 20 is made longer than the line length of the primary coil of the first filter unit 20. The inventor of the present application discovered that in such case the antiresonance in Sdd21 was suppressed as denoted by a solid line in FIG. 7. Particularly, in the common-mode choke coil 10, the line length of the fourth layer coil conductor 24 on the secondary coil side is made longer than the line lengths of the first layer coil conductor 21 and the third layer coil conductor 23 on the primary coil side and the second layer coil conductor 22 on the secondary coil side. As a result, the common-mode choke coil 10 is configured in such a way that, in the first filter unit 20, the line length of the secondary coil (the total line length of the fourth layer coil conductor 24 and the second layer coil conductor 22) is longer than the line length of the primary coil (the total line length of the first layer coil conductor 21 and the third layer coil conductor 23). In other words, the line length of a far side coil is longer than the line length of a near side coil, where, of the primary coil and the secondary coil of the first filter unit 20, the secondary coil (the second layer coil conductor 22 and the fourth layer coil conductor 24) arranged at a more distant position is the far side coil, and the primary coil (the first layer coil conductor 21 and the third layer coil conductor 23) arranged at a closer position is the near side coil, using, as references, the line lengths from the third layer coil conductor 33 (reference primary coil conductor) on the primary coil side and the second layer coil conductor 32 (reference secondary coil conductor) on the secondary coil side, which are adjacent to each other in the height direction Td and have opposite winding directions in the second filter unit 30. It is found that, with such configuration, the occurrence of an antiresonance in Sdd21 can be suppressed.

Alternatively, of the primary coil and the secondary coil of the first filter unit 20, one (the primary coil) that follows and is connected to one of the second layer coil conductor 32 and the third layer coil conductor 33 whose winding directions are opposite may be defined as the near side coil, and one that does not follow and is not connected to either the second layer coil conductor 32 or the third layer coil conductor 33, namely one (the secondary coil) that follows and is connected to a coil conductor (the first layer coil conductor 31 or the fourth layer coil conductor 34) that is neither the second layer coil conductor 32 nor the third layer coil conductor 33, may be defined as the far side coil.

Figure 8:
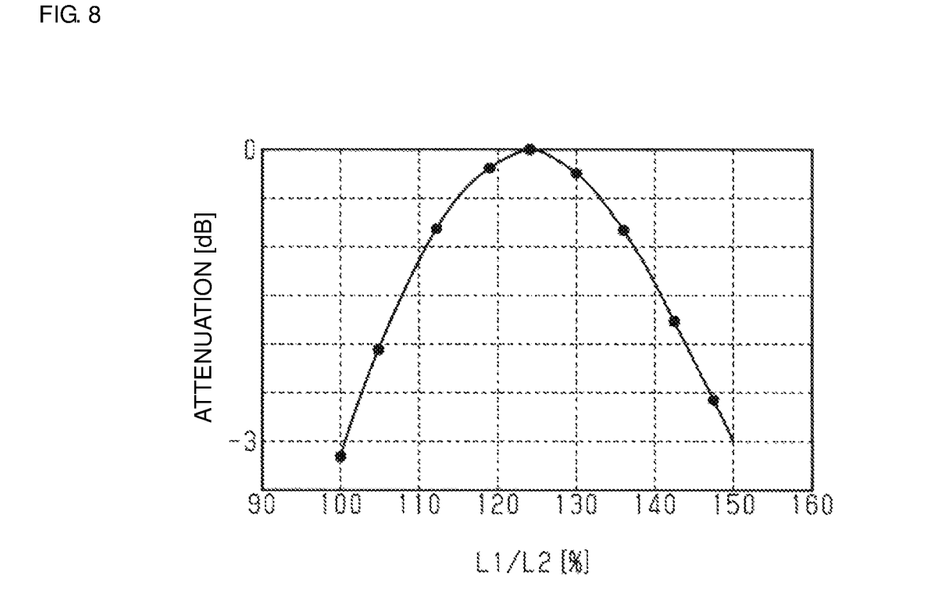
FIG. 8 is a diagram illustrating a change in attenuation due to a difference in line length.

Further, in the first filter unit 20, when L1 is the line length of the far side coil, and L2 is the line length of the near side coil, L1 and L2 are preferably set within the range of approximately L2<L1≤1.5×L2. FIG. 8 is a diagram illustrating a relationship between the ratio (%) of the foregoing L1 to L2 and the attenuation due to an antiresonance. As illustrated in FIG. 8, by setting L1 and L2 within the foregoing range, the attenuation due to an antiresonance in Sdd21 can be further suppressed compared with the case where L1=L2. Specifically, the attenuation can be limited within approximately ±3 dB.

Further, as illustrated in FIG. 4, in the far side coil of the first filter unit 20, it is preferable that the line length of the fourth layer coil conductor 24 is adjusted in such a way that the line length of the fourth layer coil conductor 24 is longer than the line lengths of the other coil conductors 21 to 23 on a winding center side of the fourth layer coil conductor 24. In other words, the inside diameter of the far side coil (the inside diameter of the fourth layer coil conductor 24) is preferably smaller than the inside diameter of the near side coil (the inside diameter of the first layer coil conductor 21 and the third layer coil conductor 23). This enables the first to fourth layer coil conductors 21 to 24 to have a substantially identical outer shape. In other words, when the line length of the far side coil is made longer than the line length of the near side coil in the first filter unit 20, there is no need to change the size of the outer shape of the far side coil because an additional length is secured on an inside diameter side of the far side coil, thereby enabling to suppress an increase in size of the common-mode choke coil 10.

Further, as described above, the numbers of turnings are different between the filter units 20 and 30 of the present example. However, the line lengths of the primary coil and the secondary coil of the first filter unit 20, in which the line length is different between the primary coil and the secondary coil, are preferably shorter than the line lengths of the primary coil and the secondary coil of the second filter unit 30. In other words, the resonant frequency of the first filter unit 20, in which the line length is different between the primary coil and the secondary coil, is preferably higher than the resonant frequency of the second filter unit 30. With respect to the overall outer shape of the common-mode choke coil 10, the first filter unit 20, which has a higher resonant frequency, namely has a smaller number of turnings, and in which the line lengths of the primary coil and the secondary coil are shorter, uses less space than the second filter unit 30, which has a lower resonant frequency, namely has a greater number of turnings, and in which the line lengths of the primary coil and the secondary coil are longer. Accordingly, when making the line lengths of the primary coil and the secondary coil different from each other, even if the line length of the fourth layer coil conductor 24 is made longer than the line lengths of the other coil conductors 21 to 23 in the first filter unit 20, an impact of increases in the width direction Wd and the length direction Ld of the common-mode choke coil 10 can be reduced.

Further, in the second filter unit 30, of the primary coil and the secondary coil, one (the second layer coil conductor 32 and the fourth layer coil conductor 34) that is connected in series to the near side coil preferably has a longer line length than one (the first layer coil conductor 31 and the third layer coil conductor 33) that is connected in series to the far side coil. This enables a difference in line length between the primary coil and the secondary coil created in the first filter unit 20 to be reduced in the second filter unit 30.

It is preferable that the total line length of the primary coils of the first filter unit 20 and the second filter unit 30 is substantially equal to the total line length of the secondary coils of the first filter unit 20 and the second filter unit 30. This enables a difference in line length between the primary coil and the secondary coil created in the first filter unit 20 to be offset in the second filter unit 30.

The present embodiment described above enables to produce the following actions and effects.

(1) The first filter unit 20 of the common-mode choke coil 10 has a configuration such that the line length of the secondary coil is longer than the line length of the primary coil by making the line length of the fourth layer coil conductor 24 on the secondary coil side longer than the line lengths of the first layer coil conductor 21 and the third layer coil conductor 23 on the primary coil side and the second layer coil conductor 22 on the secondary coil side. This enables the reduction of the signal attenuation due to an antiresonance in Sdd21.

(2) The line length of the far side coil is longer than the line length of the near side coil, where, of the primary coil and the secondary coil of the first filter unit 20, one that is arranged at a more distant position is the far side coil, and one that is arranged at a closer position is the near side coil, using, as references, the line lengths from the third layer coil conductor 33 (the reference primary coil conductor) on the primary coil side and the second layer coil conductor 32 (the reference secondary coil conductor) on the secondary coil side, which are adjacent to each other in the stacking direction and have opposite winding directions. With such configuration, the signal attenuation due to an antiresonance in Sdd21 can be further reduced. Alternatively, one (the primary coil) that follows and is connected to one of the second layer coil conductor 32 and the third layer coil conductor 33 may be defined as the near side coil, and one that does not follow and is not connected to either the second layer coil conductor 32 or the third layer coil conductor 33, namely one (the secondary coil) that follows and is connected to a coil conductor (the first layer coil conductor 31 or the fourth layer coil conductor 34) which is neither the second layer coil conductor 32 nor the third layer coil conductor 33, may be defined as the far side coil.

(3) By setting up the first filter unit 20 in the range of $L2<L1 \leq 1.5 \times L2$, where L1 is the line length of the far side coil, and L2 is the line length of the near side coil, the attenuation due to an antiresonance in Sdd21 can be further suppressed compared with the case where L1=L2. Specifically, the attenuation can be limited within approximately ±3 dB.

(4) In the first filter unit 20, in the far side coil, the line length of the fourth layer coil conductor 24 is adjusted in such a way that the line length of the fourth layer coil conductor 24 is longer than the line lengths of the other coil conductors 21 to 23 on the winding center side of the fourth layer coil conductor 24. In other words, the inside diameter of the far side coil (the inside diameter of the fourth layer coil conductor 24) is smaller than the inside diameter of the near side coil (the inside diameter of the first layer coil conductor 21 and the third layer coil conductor 23). This eliminates the need for changing the size of the outer shape of each of the coil conductors 21 to 24, thereby enabling to suppress an increase in size of the common-mode choke coil 10.

(5) The line lengths of the primary coil and the secondary coil of the first filter unit 20, in which the line length is different between the primary coil and the secondary coil, are shorter than the line lengths of the primary coil and the secondary coil of the second filter unit 30. In other words, the resonant frequency of the first filter unit 20, in which the line length is different between the primary coil and the secondary coil, is higher than the resonant frequency of the second filter unit 30. Here, with respect to the overall outer shape of the common-mode choke coil 10, the first filter unit 20, which has a higher resonant frequency, namely has a smaller number of turnings, and in which the line lengths of the primary coil and the secondary coil are shorter, uses less space than the second filter unit 30, which has a lower resonant frequency, namely has a greater number of turnings, and in which the line lengths of the primary coil and the secondary coil are longer. When making the line lengths of the primary coil and the secondary coil different from each other, even if the line length of the fourth layer coil conductor 24 is made longer than the line lengths of the other coil conductors 21 to 23 in the first filter unit 20, an impact of increases in the width direction Wd and the length direction Ld of the common-mode choke coil 10 can be reduced.

(6) In the second filter unit 30, of the primary coil and the secondary coil, one that is connected in series to the near side coil has a longer line length than one that is connected in series to the far side coil. This enables a difference in line length between the primary coil and the secondary coil created in the first filter unit 20 to be reduced in the second filter unit 30.

(7) The total line length of the primary coils of the first filter unit 20 and the second filter unit 30 is substantially equal to the total line length of the secondary coils of the first filter unit 20 and the second filter unit 30. This enables a difference in line length between the primary coil and the secondary coil created in the first filter unit 20 to be offset in the second filter unit 30.

(8) Between the first filter unit 20 and the second filter unit 30, the primary coils are connected in series, and the secondary coils are connected in series. This enables input-output terminals for the first and second filter units 20 and 30 to be brought together, thereby facilitating the connection.

(9) The first and second filter units 20 and 30 are arranged in the direction orthogonal to the stacking direction. This enables the reduction of magnetic coupling between the first and second filter units 20 and 30 and enables to suppress an adverse effect on the characteristics of the common-mode choke coil 10.

(10) The base body 14 in which a plurality of insulation layers 11 to 13 is stacked on top of each other is included, and the primary coils and the secondary coils of the first and second filter units 20 and 30 include the coil conductors 21 to 24 and the coil conductors 31 to 34, which are wound on the insulation layers 11 to 13, respectively. This enables the first and second filter units 20 and 30 to be contained within one base body 14, thereby facilitating the handling of the common-mode choke coil 10.

(11) The first outer electrode 51 and the second outer electrode 52 are electrically connected with the primary coils of the first and second filter units 20 and 30 connected in series in between, and the third outer electrode 53 and the fourth outer electrode 54 are electrically connected with the secondary coils of the first and second filter units 20 and 30 connected in series in between. With such configuration, inputs and outputs to and from the first and second filter units 20 and 30 can be brought together at the first outer electrode 51, the second outer electrode 52, the third outer electrode 53, and the fourth outer electrode 54, thereby facilitating the connection.

MODIFIED EXAMPLES

Note that the foregoing embodiment may also be appropriately modified and implemented in the following manners.

In the foregoing embodiment, the configuration is such that the line length of the fourth layer coil conductor 24 of the first filter unit 20 is longer than the line lengths of the other coil conductors of the same filter unit 20, but the configuration is not limited thereto.

Figure 9:
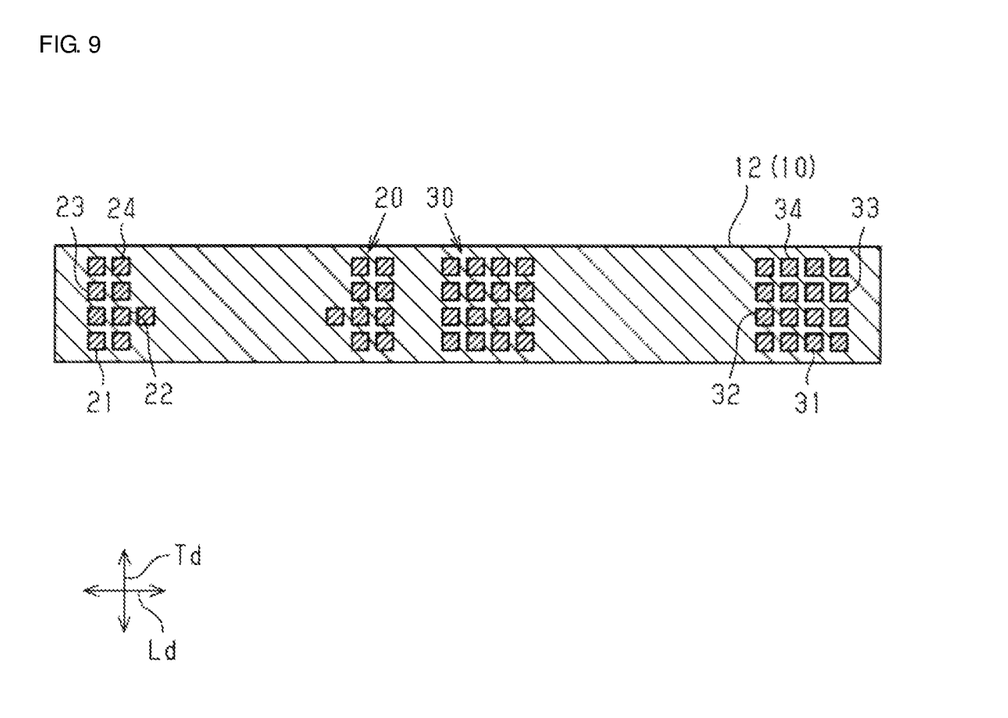
FIG. 9 is a cross-sectional view of a common-mode choke coil according to a modified example.

FIG. 9 is a cross-sectional view of a common-mode choke coil according to a modified example and illustrates a cross-section corresponding to the cross-section of FIG. 2. As illustrated in FIG. 9, in this modified example, the number of turnings of the second layer coil conductor 22 of the first filter unit 20 is greater than those of the other coil conductors 21, 23, and 24. As described above, a configuration may be employed, such that the line length of the second layer coil conductor 22 is longer than the line lengths of the other coil conductors of the same filter unit 20. Further, a configuration may also be employed, such that the line length of the second layer coil conductor 22 and the line length of the fourth layer coil conductor 24 are longer than the line lengths of the other coil conductors of the same filter unit 20. In other words, in the relationship between the first filter unit 20 and the second filter unit 30, as long as the line length of the secondary coil is longer than the line length of the primary coil in the first filter unit 20, advantageous effects similar to those in the foregoing embodiment can be obtained in any of these cases.

In the foregoing embodiment, the configuration is such that in the first filter unit 20, the line length is different between the primary coil and the secondary coil. Alternatively, the configuration may also be, for example, such that in the second filter unit 30, the line length is different between the primary coil and the secondary coil. In this case, the references are respectively the line lengths of the third layer coil conductor 23 (the reference primary coil conductor) on the primary coil side and the second layer coil conductor 22 (the reference secondary coil conductor) on the secondary coil side, which are adjacent to each other in the height direction Td and have opposite winding directions in the first filter unit 20. Accordingly, in this case, the line lengths of the coil conductors 31 and 33 of the second filter unit 30, which are arranged at more distant positions, are longer than the line lengths of the coil conductors 32 and 34 of the filter unit 30, which are arranged at closer positions. An example of such configuration is described below.

Figure 10:
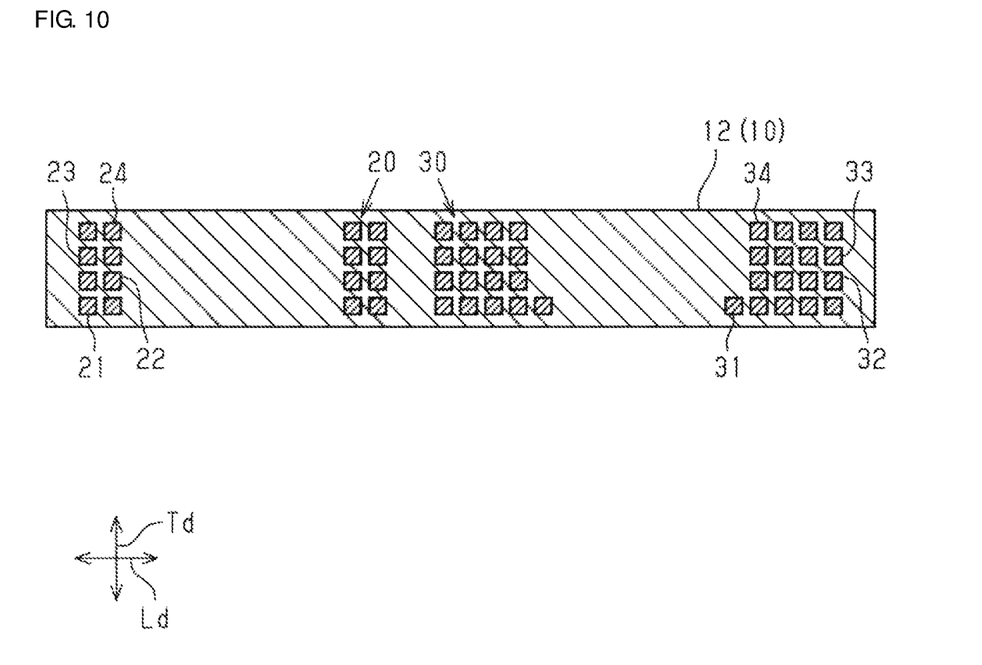
FIG. 10 is a cross-sectional view of a common-mode choke coil according to a modified example.

FIG. 10 is a cross-sectional view of a common-mode choke coil according to a modified example and illustrates a cross-section corresponding to the cross-section of FIG. 2. As illustrated in FIG. 10, a configuration may also be employed, such that the line length of the first layer coil conductor 31 that constitutes the primary coil of the second filter unit 30 is longer than the line lengths of the other coil conductors of the same filter unit 30. Further, a configuration may also be employed, such that the line length of the third layer coil conductor 33 is longer than the line lengths of the other coil conductors of the same filter unit 30. Further, a configuration may also be employed, such that the line length of the first layer coil conductor 31 and the line length of the third layer coil conductor 33 are longer than the line lengths of the other coil conductors of the same filter unit 30. With such configurations, the line length of the primary coil becomes longer than the line length of the secondary coil in the second filter unit 30. In any of the cases described above, advantageous effects similar to those in the foregoing embodiment can be obtained. As illustrated in this example, in the present application, "first" and "second" of the common-mode filter unit are labeled for the sake of convenience for distinction, and either one may be "first" or "second".

Figure 11:
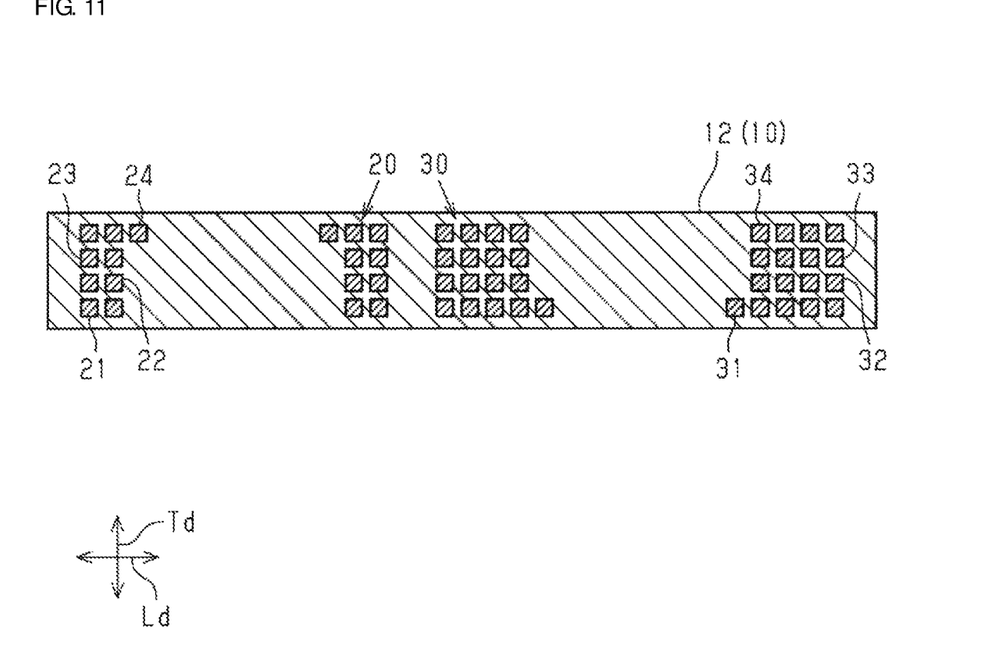
FIG. 11 is a cross-sectional view of a common-mode choke coil according to a modified example.

Note that the configuration of the embodiment and the configuration of the modified example of FIG. 10 may be combined. FIG. 11 is a cross-sectional view of a common-mode choke coil according to a modified example and illustrates a cross-section corresponding to the cross-section of FIG. 2. As illustrated in FIG. 11, a configuration may be employed, such that the line length of the fourth layer coil conductor 24 that constitutes the secondary coil of the first filter unit 20 is made longer than the line lengths of the other coil conductors of the same filter unit 20, and the line length of the first layer coil conductor 31 that constitutes the primary coil of the second filter unit 30 is made longer than the line lengths of the other coil conductors of the same filter unit 30. Even with such configuration, advantageous effects similar to those in the foregoing embodiment can be obtained.

In the foregoing embodiment, the line length is adjusted on the winding center side of the far side coil. Alternatively, the line length may be adjusted on an outside diameter side of the far side coil. Further, the line length may also be adjusted by shortening the line length of one or more of coil conductors (the first layer coil conductor 21, the third layer coil conductor 23, and the like) of the near side coil or by taking a similar measure.

In the foregoing embodiment, the outer electrode 51, the fourth layer coil conductor 24 of the first filter unit 20, the second via electrode 26, the second layer coil conductor 22 of the first filter unit 20, the intermediate via electrode 41, the fourth layer coil conductor 34 of the second filter unit 30, the second via electrode 36, the second layer coil conductor 32 of the second filter unit 30, and the outer electrode 52 are connected in order of mention. However, the mode of connection is not limited thereto. Similarly, the outer electrode 53, the third layer coil conductor 23 of the first filter unit 20, the first via electrode 25, the first layer coil conductor 21 of the first filter unit 20, the intermediate via electrode 42, the third layer coil conductor 33 of the second filter unit 30, the first via electrode 35, the first layer coil conductor 31 of the second filter unit 30, and the outer electrode 54 are connected in order of mention. However, the mode of connection is not limited thereto. An example of such configuration is described below.

Example 1

For example, the outer electrode 51, the first layer coil conductor 21 of the first filter unit 20, the second via electrode 26, the third layer coil conductor 23 of the first filter unit 20, the intermediate via electrode 41, the fourth layer coil conductor 34 of the second filter unit 30, the second via electrode 36, the second layer coil conductor 32 of the second filter unit 30, and the outer electrode 52 are connected in order of mention. Further, the outer electrode 53, the second layer coil conductor 22 of the first filter unit 20, the first via electrode 25, the fourth layer coil conductor 24 of the first filter unit 20, the intermediate via electrode 42, the third layer coil conductor 33 of the second filter unit 30, the first via electrode 35, the first layer coil conductor 31 of the second filter unit 30, and the outer electrode 54 are connected in order of mention.

Example 2

For example, the outer electrode 51, the second layer coil conductor 22 of the first filter unit 20, the second via electrode 26, the fourth layer coil conductor 24 of the first filter unit 20, the intermediate via electrode 41, the fourth layer coil conductor 34 of the second filter unit 30, the second via electrode 36, the second layer coil conductor 32 of the second filter unit 30, and the outer electrode 52 are connected in order of mention. Further, the outer electrode 53, the first layer coil conductor 21 of the first filter unit 20, the first via electrode 25, the third layer coil conductor 23 of the first filter unit 20, the intermediate via electrode 42, the third layer coil conductor 33 of the second filter unit 30, the first via electrode 35, the first layer coil conductor 31 of the second filter unit 30, and the outer electrode 54 are connected in order of mention.

The foregoing example 1 and example 2 are only some of the modes of connection, and it is possible to combine the mode of connection of the first filter unit 20 in any one of these examples including the embodiment and the mode of connection of the second filter unit 30 in another example. Note that, between the first filter unit 20 and the second filter unit 30, the primary coils are connected in series and the secondary coils are connected in series. Thus, the primary coil and the secondary coil may be switched when appropriate depending on the foregoing modification. Further, as illustrated in this, in the present application, "primary" and "secondary" of the coil are labeled for the sake of convenience for distinction, and either one may be labeled as "primary" or "secondary".

In the foregoing embodiment, the configuration is such that, with regard to the stacking direction, from the bottom face side to the top face side, the first layer coil conductor, the second layer coil conductor, the third layer coil conductor, and the fourth layer coil conductor are stacked in order of mention. Alternatively, a configuration may be employed such that, from the top face side to the bottom face side, the first layer coil conductor, the second layer coil conductor, the third layer coil conductor, and the fourth layer coil conductor are stacked on top of each other in order of mention.

In the foregoing embodiment, the configuration is such that, in the first filter unit 20 and the second filter unit 30, the coil conductors of the primary coil and the coil conductors of the secondary coil are stacked on top of each other in an alternating fashion, but the configuration is not limited thereto. For example, in the second filter unit, the first layer coil conductor, the second layer coil conductor, the third layer coil conductor, and the fourth layer coil conductor, each of which is wound in an approximately spiral shape, may be arranged in order of mention along the foregoing stacking direction, the primary coil may be formed by connecting the first layer coil conductor and the fourth layer coil conductor in series, and the secondary coil may be formed by connecting the second layer coil conductor and the third layer coil conductor in series. Note that, also in this case, in the first filter unit, the line length is preferably different between the primary coil and the secondary coil. Specifically, in the second filter unit of the foregoing case, the line length of the primary coil is longer than the line length of the secondary coil due to a difference in line length in the stacking direction of the via electrode. In this case, contrary to the second filter unit, in the first filter unit, the line length of the secondary coil is preferably longer than the line length of the primary coil. In other words, in this case, it is preferable that, for example in the first filter unit, the first layer coil conductor, the second layer coil conductor, the third layer coil conductor, and the fourth layer coil conductor, each of which is wound in an approximately spiral shape, are arranged in order of mention along the foregoing stacking direction, the secondary coil is formed by connecting the first layer coil conductor and the fourth layer coil conductor in series, and the primary coil is formed by connecting the second layer coil conductor and the third layer coil conductor in series. It was confirmed that the signal attenuation due to an antiresonance in Sdd21 was reduced in this case.

In the foregoing embodiment, the configuration is such that the first filter unit 20 and the second filter unit 30 are arranged in the direction (the length direction Ld) orthogonal to the height direction Td, which is the stacking direction of the respective coil conductors 21 to 24 and 31 to 34. Alternatively, a configuration such that the first filter unit and the second filter unit are arranged in the height direction Td may also be employed. In this case, when each filter unit has a four-layer structure as is the case with the foregoing embodiment, a structure is such that eight coil conductors are stacked on top of each other.

In the foregoing embodiment, the primary coil and the secondary coil of each of the filter units 20 and 30 are each formed of two coil conductors. Alternatively, each of the primary coil and the secondary coil may be formed of three or more coil conductors.

In the foregoing embodiment, the configuration is such that the outer electrodes 51 to 54 and the bottom face electrodes 55 are exposed, but the configuration is not limited thereto. For example, a configuration may be employed such that the outer electrodes 51 to 54 are not exposed and only the bottom face electrodes 55 are exposed.

In the foregoing embodiment, the outer electrodes 51 to 54 and the bottom face electrodes 55 are formed as separate components, but these may be formed as integrated components.

In the foregoing embodiment, two filter units, the first filter unit 20 and the second filter unit 30, are included as the common-mode filter units, but the common-mode choke coil may include three or more of common-mode filter units. In this case, a plurality of common-mode filter units only needs to include at least one common-mode filter unit whose resonant frequency is different from a resonant frequency of another common-mode filter unit, and the line length may be different between the primary coil and the secondary coil in the at least one common-mode filter unit, or the line length may be different between the primary coil and the secondary coil in the another common-mode filter unit. That is to say, a pair having different resonant frequencies and a pair having different line lengths may be the same pair in one filter unit or may be a pair across different filter units.

The foregoing embodiment and the foregoing modified examples may be combined when appropriate.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A common-mode choke coil comprising:
a plurality of common-mode filter units each formed by arranging a primary coil and a secondary coil in a stacking direction,
wherein
the plurality of common-mode filter units includes one common-mode filter unit whose resonant frequency is different from a resonant frequency of another common-mode filter unit and one common-mode filter unit in which a line length is different between the primary coil and the secondary coil,
the plurality of common-mode filter units includes a first filter unit and a second filter unit whose resonant frequencies are different from one another, and between the first filter unit and the second filter unit, the primary coils are connected in series, and the secondary coils are connected in series,
in the second filter unit, a plurality of coil conductors are arranged along the stacking direction, each of the plurality of coil conductors being wound in a spiral shape, and a reference primary coil conductor and a reference secondary coil conductor are adjacent to one another in the stacking direction and have opposite winding directions, the reference primary coil conductor being one of the plurality of coil conductors that constitutes the primary coil, the reference secondary coil conductor being one of the plurality of coil conductors that constitutes the secondary coil,
a line length of a far side coil of the first filter unit is longer than a line length of a near side coil of the first filter unit, where, of the primary coil and the secondary coil of the first filter unit, one that is arranged at a more distant position is the far side coil, and one that is arranged at a closer position is the near side coil, using, as references, line lengths from the reference primary coil conductor and the reference secondary coil conductor, and
L1 and L2 are set within a range of $L2 < L1 \leq 1.5 \times L2$, where L1 is the line length of the far side coil, and L2 is the line length of the near side coil.

2. A common-mode choke coil comprising:
a plurality of common-mode filter units each formed by arranging a primary coil and a secondary coil in a stacking direction,
wherein
the plurality of common-mode filter units includes one common-mode filter unit whose resonant frequency is different from a resonant frequency of another common-mode filter unit and one common-mode filter unit in which a line length is different between the primary coil and the secondary coil,
the plurality of common-mode filter units includes a first filter unit and a second filter unit whose resonant frequencies are different from one another, and between the first filter unit and the second filter unit, the primary coils are connected in series, and the secondary coils are connected in series,
in the second filter unit, a plurality of coil conductors are arranged along the stacking direction, each of the plurality of coil conductors being wound in a spiral shape, and a reference primary coil conductor and a reference secondary coil conductor are adjacent to one another in the stacking direction and have opposite winding directions, the reference primary coil conductor being one of the plurality of coil conductors that constitutes the primary coil, the reference secondary coil conductor being one of the plurality of coil conductors that constitutes the secondary coil,
a line length of a far side coil of the first filter unit is longer than a line length of a near side coil of the first filter unit, where, of the primary coil and the secondary coil of the first filter unit, one that is arranged at a more distant position is the far side coil, and one that is arranged at a closer position is the near side coil, using, as references, line lengths from the reference primary coil conductor and the reference secondary coil conductor, and
an inside diameter of the far side coil is smaller than an inside diameter of the near side coil.

3. A common-mode choke coil comprising:
a plurality of common-mode filter units each formed by arranging a primary coil and a secondary coil in a stacking direction,
wherein the plurality of common-mode filter units includes one common-mode filter unit whose resonant frequency is different from a resonant frequency of another common-mode filter unit and one common-mode filter unit in which a line length is different between the primary coil and the secondary coil to reduce signal attenuation due to an antiresonance in Sdd21.

4. The common-mode choke coil according to claim 3, further comprising:

a base body in which a plurality of insulation layers are stacked on top of another, wherein each of the primary coils and the secondary coils of the plurality of common-mode filter units includes a coil conductor wound on one of the plurality of insulation layers.

5. The common-mode choke coil according to claim 4, further comprising:

a first outer electrode, a second outer electrode, a third outer electrode, and a fourth outer electrode that are formed in the base body, wherein the first outer electrode and the second outer electrode are electrically connected with the primary coils of the plurality of common-mode filter units connected in series in between, and the third outer electrode and the fourth outer electrode are electrically connected with the secondary coils of the plurality of common-mode filter units connected in series in between.

6. The common-mode choke coil according to claim 3, wherein among the plurality of common-mode filter units, the primary coils are connected in series, and the secondary coils are connected in series.

7. The common-mode choke coil according to claim 3, wherein the plurality of common-mode filter units is arranged in a direction orthogonal to the stacking direction.

8. The common-mode choke coil according to claim 3, wherein the plurality of common-mode filter units includes a first filter unit and a second filter unit whose resonant frequencies are different from one another, and between the first filter unit and the second filter unit, the primary coils are connected in series, and the secondary coils are connected in series, in the second filter unit, a plurality of coil conductors are arranged along the stacking direction, each of the plurality of coil conductors being wound in a spiral shape, and a reference primary coil conductor and a reference secondary coil conductor are adjacent to one another in the stacking direction and have opposite winding directions, the reference primary coil conductor being one of the plurality of coil conductors that constitutes the primary coil, the reference secondary coil conductor being one of the plurality of coil conductors that constitutes the secondary coil, and a line length of a far side coil of the first filter unit is longer than a line length of a near side coil of the first filter unit, where, of the primary coil and the secondary coil of the first filter unit, one that is arranged at a more distant position is the far side coil, and one that is arranged at a closer position is the near side coil, using, as references, line lengths from the reference primary coil conductor and the reference secondary coil conductor.

9. The common-mode choke coil according to claim 8, wherein, in the second filter unit, of the primary coil and the secondary coil, one that is connected in series to the near side coil has a longer line length than one that is connected in series to the far side coil.

10. The common-mode choke coil according to claim 8, wherein a total line length of the primary coils of the first filter unit and the second filter unit is substantially equal to a total line length of the secondary coils of the first filter unit and the second filter unit.

11. The common-mode choke coil according to claim 8, wherein, in the far side coil, the line length is longer on a winding center side.

12. The common-mode choke coil according to claim 8, wherein line lengths of the primary coil and the secondary coil of the first filter unit are shorter than line lengths of the primary coil and the secondary coil of the second filter unit, respectively.

13. The common-mode choke coil according to claim 8, wherein a resonant frequency of the first filter unit is higher than a resonant frequency of the second filter unit.

14. The common-mode choke coil according to claim 8, wherein in the second filter unit, a first layer coil conductor, a second layer coil conductor, a third layer coil conductor, and a fourth layer coil conductor are arranged in order of mention along the stacking direction, each of the first layer coil conductor, the second layer coil conductor, the third layer coil conductor, and the fourth layer coil conductor being wound in an spiral shape; following one of the primary coil and the secondary coil of the first filter unit, the fourth layer coil conductor and the second layer coil conductor are connected in series in order of mention; and following another of the primary coil and the secondary coil of the first filter unit, the third layer coil conductor and the first layer coil conductor are connected in series in order of mention, and of the primary coil and the secondary coil of the first filter unit, one that follows and is connected to the fourth layer coil conductor is the far side coil, and one that follows and is connected to the third layer coil conductor is the near side coil.

15. The common-mode choke coil according to claim 3, wherein the plurality of common-mode filter units includes a first filter unit and a second filter unit whose resonant frequencies are different from one another, and between the first filter unit and the second filter unit, the primary coils are connected in series, and the secondary coils are connected in series, in the second filter unit, a first layer coil conductor, a second layer coil conductor, a third layer coil conductor, and a fourth layer coil conductor are arranged in order of mention along the stacking direction, each of the first layer coil conductor, the second layer coil conductor, the third layer coil conductor, and the fourth layer coil conductor being wound in an spiral shape; following one of the primary coil and the secondary coil of the first filter unit, the fourth layer coil conductor and the second layer coil conductor are connected in series in order of mention; and following another of the primary coil and the secondary coil of the first filter unit, the third layer coil conductor and the first layer coil conductor are connected in series in order of mention, and a line length of a far side coil of the first filter unit is longer than a line length of a near side coil of the first filter unit, where, of the primary coil and the secondary coil of the first filter unit, one that follows and is connected to the fourth layer coil conductor is the far side coil, and one that follows and is connected to the third layer coil conductor is the near side coil.

16. The common-mode choke coil according to claim 15, wherein L1 and L2 are set within a range of $L2 < L1 \leq 1.5 \times L2$, where L1 is the line length of the far side coil, and L2 is the line length of the near side coil.

17. The common-mode choke coil according to claim 15, wherein, in the far side coil, the line length is longer on a winding center side.

18. The common-mode choke coil according to claim 15, wherein an inside diameter of the far side coil is smaller than an inside diameter of the near side coil.

19. The common-mode choke coil according to claim 15, wherein line lengths of the primary coil and the secondary coil of the first filter unit are shorter than line lengths of the primary coil and the secondary coil of the second filter unit, respectively.

20. The common-mode choke coil according to claim 15, wherein a resonant frequency of the first filter unit is higher than a resonant frequency of the second filter unit.

\* \* \* \* \*